(12) United States Patent
Emira et al.

(10) Patent No.: US 10,879,915 B1
(45) Date of Patent: Dec. 29, 2020

(54) TRANSMITTER WITH REDUCED VCO PULLING

(71) Applicant: GOODIX TECHNOLOGY INC., San Diego, CA (US)

(72) Inventors: Ahmed Emira, San Diego, CA (US); Faisal Hussien, San Diego, CA (US); Esmail Babakrpur Nalousi, San Diego, CA (US)

(73) Assignee: GOODIX TECHNOLOGY INC., San Diego, CA (US)

( * ) Notice: Subject to any disclaimer, the term of this patent is extended or adjusted under 35 U.S.C. 154(b) by 0 days.

(21) Appl. No.: 16/739,069

(22) Filed: Jan. 9, 2020

(51) Int. Cl.
| | |
|---|---|
| *H03L 7/16* | (2006.01) |
| *H03L 7/089* | (2006.01) |
| *H03F 3/24* | (2006.01) |
| *H03L 7/099* | (2006.01) |
| *H04L 7/00* | (2006.01) |
| *H03K 5/1252* | (2006.01) |
| *H04B 1/02* | (2006.01) |
| *H04B 1/04* | (2006.01) |

(52) U.S. Cl.
CPC .................. *H03L 7/16* (2013.01); *H03F 3/24* (2013.01); *H03K 5/1252* (2013.01); *H03L 7/0891* (2013.01); *H03L 7/099* (2013.01); *H04B 1/02* (2013.01); *H04B 1/0475* (2013.01); *H04L 7/0033* (2013.01); *H04L 7/0037* (2013.01); *H04L 7/0041* (2013.01); *H04B 2001/0408* (2013.01)

(58) Field of Classification Search
CPC ......... H03L 7/16; H03L 7/099; H03L 7/0891; H03L 7/0802; H04L 7/0033; H04L 7/0037; H04L 7/0041; H03F 3/24; H04B 2001/0408; H04B 1/0475; H03K 5/1252; H03K 2005/0019
USPC .................... 455/260; 375/300, 371; 331/74; 332/100; 340/870.11
See application file for complete search history.

(56) References Cited

U.S. PATENT DOCUMENTS

| | | | | |
|---|---|---|---|---|
| 5,767,791 | A * | 6/1998 | Stoop ..................... | A61B 5/1113 340/870.11 |
| 2007/0189417 | A1 * | 8/2007 | Waheed .................. | H04L 7/005 375/300 |
| 2018/0254774 | A1 * | 9/2018 | Thijssen ............... | H03L 7/0805 |

* cited by examiner

*Primary Examiner* — Arnold M Kinkead
(74) *Attorney, Agent, or Firm* — Kilpatrick Townsend & Stockton LLP

(57) ABSTRACT

A transmitter circuit includes a phase locked loop circuit, having one or more operational characteristics indicative of an operating state of the phase locked loop circuit. The phase locked loop circuit is configured to generate a frequency signal. The transmitter circuit also includes a power amplifier configured to selectively drive an antenna with a drive signal according to the frequency signal, and a programmable delay circuit configured to controllably extend a propagation delay between the frequency signal and the drive signal of the power amplifier. The programmable delay circuit is programmed such that a first value of a particular operational characteristic of the phase locked loop circuit is substantially equal to a second value of the operational characteristic of the phase locked loop circuit. The first value is measured with the power amplifier not driving the antenna. The second value is measured with the power amplifier driving the antenna.

20 Claims, 2 Drawing Sheets

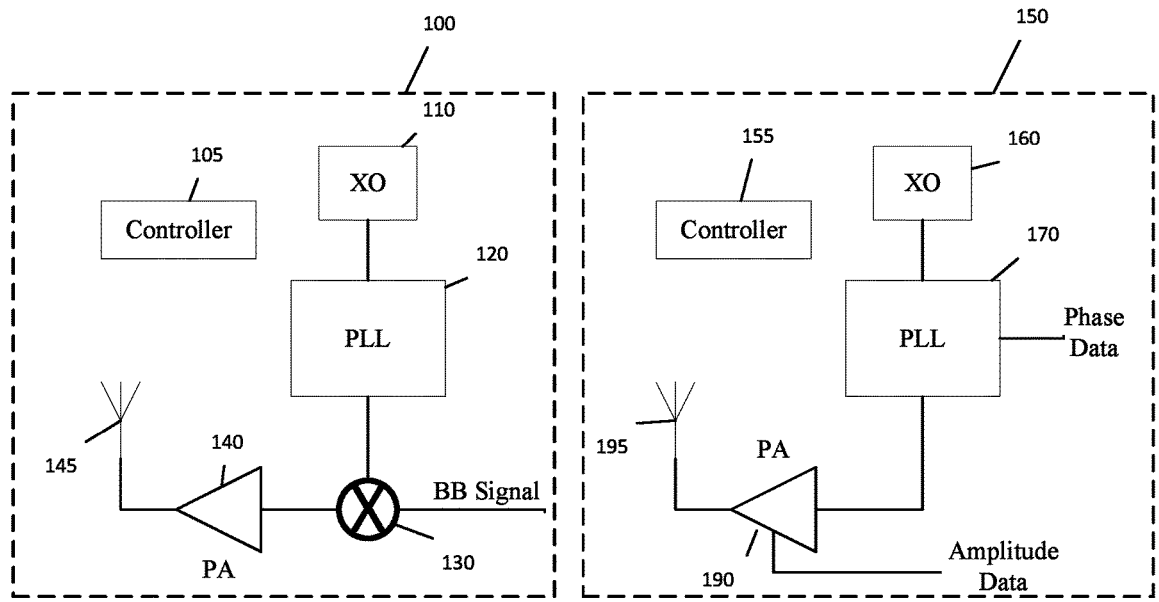
Figure 1A
Figure 1B
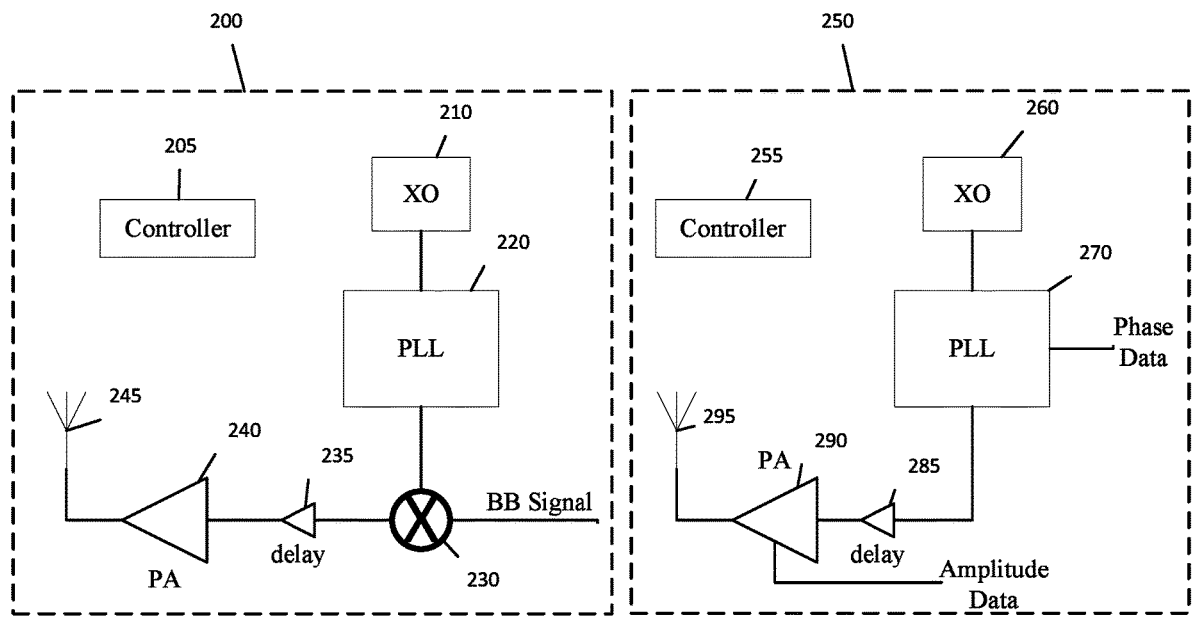
Figure 2A
Figure 2B

TRANSMITTER WITH REDUCED VCO PULLING

FIELD OF THE INVENTION

The present application generally pertains to transmitter circuits, and more particularly to transmitter circuits which have low frequency shift induced as a result of the power amplifier.

BACKGROUND OF THE INVENTION

Transmitter circuits frequently have a phase locked loop (PLL) circuit which generates a signal which is modulated with an information carrying signal and transmitted with an antenna driven by a power amplifier. The power amplifier tends to generate a signal which is coupled to the PLL. The coupled signal disturbs the output of the PLL, such that the frequency output of the PLL is undesirably shifted from its intended target.

BRIEF SUMMARY OF THE INVENTION

One inventive aspect is a transmitter circuit. The transmitter circuit includes a phase locked loop circuit, having one or more operational characteristics indicative of an operating state of the phase locked loop circuit, where the phase locked loop circuit is configured to generate a frequency signal. The transmitter circuit also includes a power amplifier configured to selectively drive an antenna with a drive signal according to the frequency signal, and a programmable delay circuit configured to controllably extend a propagation delay between the frequency signal generated by the phase locked loop circuit and the drive signal of the power amplifier, where the programmable delay circuit is programmed such that a first value of a particular operational characteristic of the phase locked loop circuit is substantially equal to a second value of the operational characteristic of the phase locked loop circuit, where the first value is measured with the power amplifier not driving the antenna, and where the second value is measured with the power amplifier driving the antenna.

BRIEF DESCRIPTION OF THE DRAWINGS

FIGS. 1A and 1B are schematic diagrams of transmitter circuits according to an embodiment.

FIGS. 2A and 2B are schematic diagrams of transmitter circuits according to other embodiments.

DETAILED DESCRIPTION OF THE INVENTION

Figure 3:
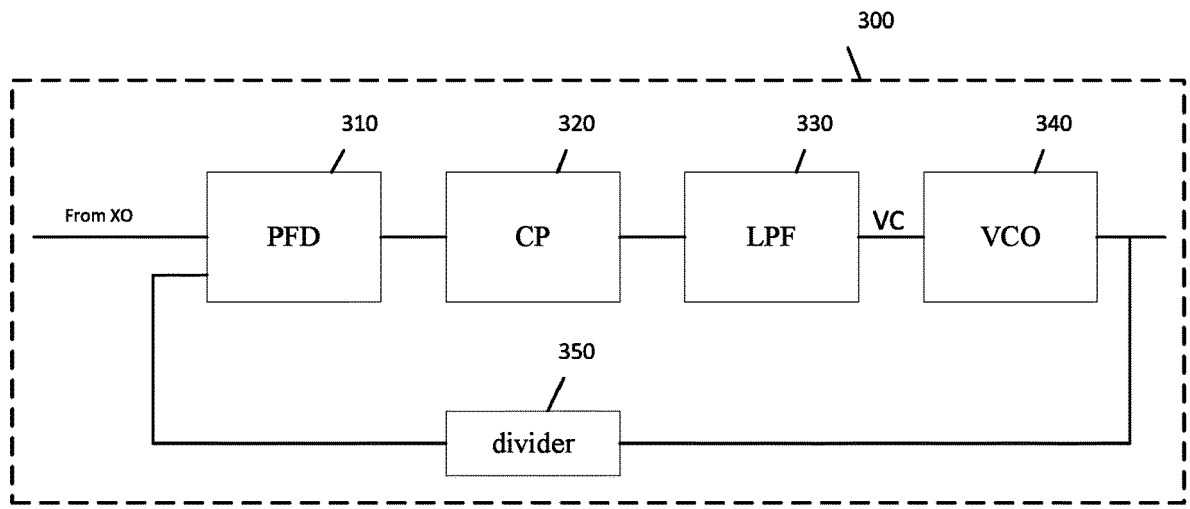
FIG. 3 is a schematic diagram of a phase locked loop (PLL) circuit.

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

FIG. 1A is a schematic diagram of a linear or direct conversion transmitter circuit 100 according to an embodiment.

Linear conversion transmitter circuit 100 includes controller 105, crystal oscillator (XO) circuit 110, phase locked loop circuit 120, mixer 130, power amplifier 140, and antenna 145.

Crystal oscillator circuit 110 generates a reference frequency which is used by phase locked loop circuit 120 to generate an RF transmission frequency signal. Mixer 130 modulates the RF transmission frequency signal with a baseband signal (BB signal) carrying information to be transmitted. The modulated RF transmission frequency signal is provided to power amplifier 140, and power amplifier 140 drives the antenna 145 with a power amplified modulated RF transmission frequency signal. Consequently, the power amplified modulated RF transmission frequency signal is broadcast by the antenna 145.

Controller 105 generates control signals which control various programmable parameters of one or more of crystal oscillator circuit 110, phase locked loop circuit 120, mixer 130, power amplifier 140, and antenna 145, as understood by one of ordinary skill in the art.

FIG. 1B is a schematic diagram of a polar transmitter circuit 150 according to an embodiment.

Polar transmitter circuit 150 includes controller 155, crystal oscillator circuit 160, phase locked loop circuit 170, power amplifier 190, and antenna 195.

Crystal oscillator circuit 160 generates a reference frequency which is used by phase locked loop circuit 170 to generate an RF transmission frequency signal. The phase locked loop circuit 170 receives phase data and modulates the generated RF transmission frequency signal with the phase data. The modulated RF transmission frequency signal is provided to power amplifier 190, which also receives amplitude data. Power amplifier 190 further modulates modulated RF transmission frequency signal with the amplitude data, and power amplifier 190 drives the antenna 195 with the RF transmission frequency signal modulated with both phase and amplitude data. Consequently, the RF transmission frequency signal with both phase and amplitude data is broadcast by the antenna 195.

Controller 155 generates control signals which control various programmable parameters of one or more of crystal oscillator circuit 160, phase locked loop circuit 170, power amplifier 190, and antenna 195, as understood by one of ordinary skill in the art.

FIG. 2A is a schematic diagram of a linear or direct conversion transmitter circuit 200 according to another embodiment.

Linear conversion transmitter circuit 200 includes crystal oscillator circuit 210, phase locked loop circuit 220, mixer 230, programmable delay element 235, power amplifier 240, and antenna 245.

Crystal oscillator circuit 210 generates a reference frequency which is used by phase locked loop circuit 220 to generate an RF transmission frequency signal. Mixer 230 modulates the RF transmission frequency signal with a baseband signal carrying information to be transmitted. The modulated RF transmission frequency signal is delayed by programmable delay element 235 and provided to power amplifier 240. Power amplifier 240 then drives the antenna 245 with a power amplified delayed modulated RF transmission frequency signal. Consequently, the power amplified delayed modulated RF transmission frequency signal is broadcast by the antenna 245.

In alternative embodiments, programmable delay element 235 receives the RF transmission frequency signal from phase locked loop circuit 170 and provides a delayed version of the RF transmission frequency signal to the mixer 230. In such embodiments, the mixer 230 provides a delayed RF transmission frequency signal modulated by the baseband signal directly to the power amplifier 240.

Controller 205 generates control signals which control various programmable parameters of one or more of crystal oscillator circuit 210, phase locked loop circuit 220, mixer 230, programmable delay element 235, power amplifier 240, and antenna 245, as understood by one of ordinary skill in the art.

For example, controller 205 may generate control signals for programmable delay element 235, such that programmable delay element 235 adjusts and controls the amount of delay the modulated RF transmission frequency signal experiences as a consequence of being processed by programmable delay element 235. An embodiment of a method of determining the control signals is discussed below with reference to FIG. 4, below.

FIG. 2B is a schematic diagram of a polar transmitter circuit 250 according to an embodiment.

Polar transmitter circuit 250 includes controller 255, crystal oscillator circuit 260, phase locked loop circuit 270, programmable delay element 285, power amplifier 290, and antenna 295.

Crystal oscillator circuit 260 generates a reference frequency which is used by phase locked loop circuit 270 to generate an RF transmission frequency signal. The phase locked loop circuit 270 receives phase data and modulates the generated RF transmission frequency signal with the phase data. The modulated RF transmission frequency signal is delayed by programmable delay element 285 and provided to power amplifier 290. Power amplifier 290 also receives amplitude data, and modulates the delayed modulated RF transmission frequency signal with the amplitude data. Power amplifier 290, accordingly, drives the antenna 295 with the delayed modulated RF transmission frequency signal modulated with both phase and amplitude data. Consequently, the delayed RF transmission frequency signal with both phase and amplitude data is broadcast by the antenna 295.

Controller 255 generates control signals which control various programmable parameters of one or more of crystal oscillator circuit 260, phase locked loop circuit 270, programmable delay element 285, power amplifier 290, and antenna 295, as understood by one of ordinary skill in the art.

For example, controller 255 may generate control signals for programmable delay element 285, such that programmable delay element 285 adjusts and controls the amount of delay the modulated RF transmission frequency signal experiences as a consequence of being processed by programmable delay element 285. An embodiment of a method of determining the control signals is discussed below with reference to FIG. 4, below.

FIG. 3 is a schematic diagram of a phase locked loop (PLL) circuit 300. Phase locked loop circuit 300 may be used as any of the phase locked circuits discussed herein. Other phase locked loop circuits may alternatively be used, and the inventive principles and aspects discussed herein may be implemented and applied thereto by those of skill in the art.

Phase locked loop circuit 300 includes phase frequency detector (PFD) 310, charge pump (CP) 320, low-pass filter (LPF) 330, voltage control oscillator (VCO) 340, and divider 350.

Phase frequency detector 300 generates pulses in response to timing differences between clock edges received from, for example, a crystal oscillator circuit and clock edges received from divider 350.

Charge pump 320 receives the pulses and generates an output voltage corresponding with an integration of the pulses.

Low-pass filter 330 receives the output voltage from charge pump 320 and attenuates high-frequency components of the output voltage to generate a voltage at node VC.

Voltage controlled oscillator 340 receives the voltage at node VC and generates an output signal which oscillates at a frequency corresponding with the voltage received at node VC.

Divider 350 receives the output signal and generates the clock edges received by phase frequency detector 310. The clock edges generated by divider 350 occur at a frequency corresponding with the frequency of output signal received from voltage controlled oscillator 340 divided by a particular value.

According to principles well understood in the art, phase locked loop circuit 300 forms a feedback loop which causes the frequency of the clock edges generated by divider 350 to be substantially identical to the frequency of clock edges received from the crystal oscillator. In addition, the feedback loop causes the phase of the clock edges generated by divider 350 to differ from the phase of clock edges received from crystal oscillator by an amount which causes phase frequency detector 310, charge pump, 320, and low-pass filter 330 to collectively generate a voltage at node VC which causes voltage control oscillator 340 to generate clock edges having a frequency, which, when divided by divider 350, is substantially identical to the frequency of the clock edges received by phase frequency detector 130 from the crystal oscillator.

Figure 4:
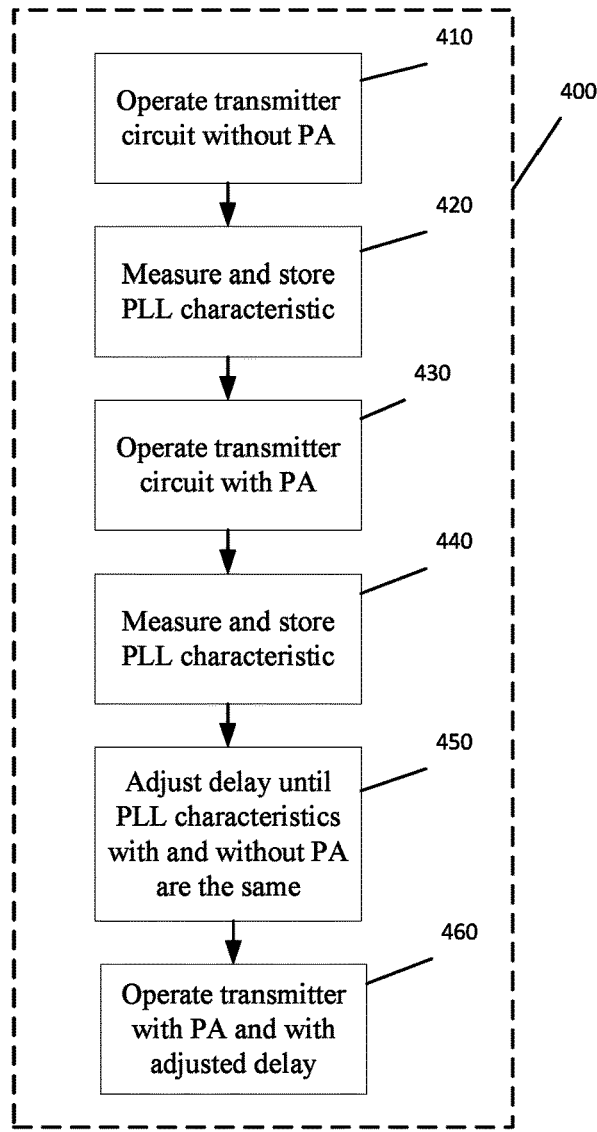
FIG. 4 is a flowchart diagram illustrating a method of operating a transmitter circuit.

FIG. 4 is a flowchart diagram illustrating a method 400 of operating a transmitter circuit, such as either of transmitter circuits 200 and 250 of FIGS. 2A and 2B, respectively. The method 400 is described below with reference to either of transmitter circuits 200 and 250 of FIGS. 2A and 2B, respectively.

At 410, the controller causes the crystal oscillator circuit and the phase locked loop circuit to operate. While the crystal oscillator circuit and the phase locked loop circuit are operated, the controller also causes the power amplifier (PA) to not operate. While not operating, the power amplifier does not generate signals which affect the frequency output of the phase locked loop circuit.

In some embodiments, while the crystal oscillator circuit and the phase locked circuit are operated, power amplifier receives no input signal, or receives a constant input signal. In some embodiments, while the crystal oscillator circuit and the phase locked circuit are operated, the power amplifier is powered down, for example by preventing a power supply node connected to the power amplifier from providing current to the power amplifier or at least to a portion of the power amplifier.

In some embodiments, while the crystal oscillator circuit and the phase locked loop circuit are operated, the controller causes the delay circuit to not operate, such that the delay circuit does not generate signals which would cause the power amplifier to affect the frequency output of phase locked loop circuit.

In some embodiments, while the crystal oscillator circuit and the phase locked circuit are operated, the delay circuit or a portion of the delay circuit receives no input signal, or receives a constant input signal. In some embodiments, while the crystal oscillator circuit and the phase locked circuit are operated, the delay circuit is powered down, for example by preventing a power supply node connected to the delay circuit from providing current to the delay circuit or at least to a portion of the delay circuit.

In some embodiments, while the crystal oscillator circuit and the phase locked circuit are operated, the controller cause the mixer to not operate, such that the mixer does not generate signals which would cause the power amplifier to affect the frequency output of phase locked loop circuit.

In some embodiments, while the crystal oscillator circuit and the phase locked circuit are operated, the mixer or a portion of the mixer receives no input signal, or receives a constant input signal. In some embodiments, while the crystal oscillator circuit and the phase locked circuit are operated, the mixer is powered down, for example by preventing a power supply node connected to the mixer from providing current to the mixer or at least to a portion of the mixer.

At 420, one or more characteristics of the operating state of the phase locked loop circuit is determined and stored in a memory, for example, in the controller, as a first measurement. For example, a representation of the voltage at node VC of the phase locked loop circuit 300 of FIG. 3 may be determined and stored in the memory as the first measurement. For example, the transmitter may include or use an analog to digital converter to generate a digital representation of the voltage at node VC, and store the digital representation in the memory. Additionally or alternatively, a representation of the frequency of the output of the voltage control oscillator or the divider of the phase locked loop circuit 300 of FIG. 3 may be determined using techniques known in the art, and stored in a memory as or as part of the first measurement. Additionally or alternatively, one or more other characteristics of the operating state of the phase locked loop circuit may be determined and stored in the memory as or as part of the first measurement.

At 430, the controller causes the crystal oscillator circuit, the phase locked loop circuit, the mixer, the delay circuit, and the power amplifier to operate. In some embodiments, at 430, the controller causes the mixer to receive a baseband signal. In alternative embodiments, at 430, the controller causes the mixer to not receive a baseband signal or causes the mixer to receive a DC signal. In some embodiments, at 430, the controller causes the power amplifier to drive the antenna, such that an RF signal is broadcast. In some embodiments, at 430, the controller causes power amplifier to not drive the antenna.

At 440, while the crystal oscillator circuit, phase locked circuit, the mixer, the delay circuit, and the power amplifier are operating as described with reference to 430, the controller causes the one or more characteristics of the operating state of phase locked loop circuit determined at 420 to again be determined and stored as a second measurement.

At 450, while the crystal oscillator circuit, phase locked circuit, the mixer, the delay circuit, and the power amplifier are operating as described with reference to 430. In addition, the controller adjusts control signals provided to the delay circuit to operate the delay circuit with the adjusted delay while determining and storing second measurements at each control signal value, as described at 440.

In addition, at 450, each of the second measurements is compared with the first measurement. In some embodiments, a representation of the control signal value causing a minimum difference between the first measurement and a second measurement is stored in the memory. In some embodiments, a representation of the control signal value causing a difference between the first measurement and a second measurement to be less than a threshold is stored in the memory.

The stored representation may, for example, be an indication of non-ideal output of the phase locked loop circuit of the transmitter. For example, the stored representation may be an indication of a disturbance in the frequency of the output of the phase locked loop circuit, for example, caused by undesirable signal coupling from other components of the transmitter, such as the power amplifier, to the phase locked loop circuit, for example, to a voltage control oscillator of the phase locked loop circuit.

At 460, the controller causes the transmitter to operate with the mixer receiving a baseband signal and with the power amplifier driving the antenna such that an RF signal including the baseband signal information is transmitted by the antenna. In addition, at 460, the controller provides one or more control signals corresponding with the representation of the control signal value stored at 450 to the delay element. Consequently, the delay of the delay element at 460 is substantially identical to the delay of the delay element associated with the representation of the control signal value stored at 450.

For example, the delay of the delay element at 460 may be substantially equal to the delay of the delay element at 450 which caused the minimum difference between the first measurement and a second measurement. As another example, the delay of the delay element at 460 may be substantially equal to the delay of the delay element at 450 which caused the difference between the first measurement and a second measurement to be less than the threshold.

In some embodiments, at 460, the phase difference between the signal at the power amplifier output and the phase locked loop output signal may be substantially zero. Alternatively, in some embodiments, at 460, the phase difference between the signal that the power amplifier output and the phase locked loop output signal may be substantially 180°.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A transmitter circuit, comprising:
   a phase locked loop circuit, having one or more operational characteristics indicative of an operating state of the phase locked loop circuit, wherein the phase locked loop circuit is configured to generate a frequency signal;
   a power amplifier, configured to selectively drive an antenna with a drive signal according to the frequency signal; and
   a programmable delay circuit, configured to controllably extend a propagation delay between the frequency signal generated by the phase locked loop circuit and the drive signal of the power amplifier,
   wherein the programmable delay circuit is programmed such that a first value of a particular operational characteristic of the phase locked loop circuit is substantially equal to a second value of the operational characteristic of the phase locked loop circuit, wherein the first value is measured with the power amplifier not driving the antenna, and wherein the second value is measured with the power amplifier driving the antenna.

2. The transmitter circuit of claim 1, wherein the phase locked loop circuit comprises a voltage controlled oscillator, and the particular operational characteristic of the phase locked loop is an input voltage to the voltage controlled oscillator.

3. The transmitter circuit of claim 1, wherein the first value of the particular operational characteristic of the phase locked loop circuit is measured with the programmable delay circuit not functioning.

4. The transmitter circuit of claim 1, wherein the second value of the particular operational characteristic of the phase locked loop circuit is measured with the drive signal not carrying a baseband signal.

5. The transmitter circuit of claim 1, further comprising a mixer configured to modulate the frequency signal with a baseband information carrying signal.

6. The transmitter circuit of claim 1, wherein the phase locked loop circuit is configured to modulate the frequency signal with first data of a baseband information carrying signal, and wherein the power amplifier is configured to modulate the frequency signal with second data of the baseband information carrying signal such that the drive signal carries the baseband information carrying signal.

7. The transmitter circuit of claim 1, wherein a phase difference between the frequency signal generated by the phase locked loop circuit and the drive signal generated by the power amplifier is substantially 180° or is substantially zero.

8. A method of operating a transmitter circuit, the transmitter circuit comprising:
  a phase locked loop circuit, having one or more operational characteristics indicative of an operating state of the phase locked loop circuit;
  a power amplifier; and
  a programmable delay circuit,
  the method comprising:
    with the phase locked loop circuit, generating a frequency signal;
    with the power amplifier, selectively driving an antenna with a drive signal according to the frequency signal; and
    with the programmable delay circuit, controllably extending a propagation delay between the frequency signal generated by the phase locked loop circuit and the drive signal of the power amplifier,
    wherein the programmable delay circuit is programmed such that a first value of a particular operational characteristic of the phase locked loop circuit is substantially equal to a second value of the operational characteristic of the phase locked loop circuit, wherein the first value is measured with the power amplifier not driving the antenna, and wherein the second value is measured with the power amplifier driving the antenna.

9. The method of claim 8, wherein the phase locked loop circuit comprises a voltage controlled oscillator, and the particular operational characteristic of the phase locked loop circuit is an input voltage to the voltage controlled oscillator.

10. The method of claim 8, wherein the first value of the particular operational characteristic of the phase locked loop circuit is measured with the programmable delay circuit not functioning.

11. The method of claim 8, wherein the second value of the particular operational characteristic of the phase locked loop circuit is measured with the drive signal not carrying a baseband signal.

12. The method of claim 8, the transmitter circuit further comprising a mixer configured to modulate the frequency signal with a baseband information carrying signal.

13. The method of claim 8, wherein the phase locked loop circuit is configured to modulate the frequency signal with first data of a baseband information carrying signal, and wherein the power amplifier is configured to modulate the frequency signal with second data of the baseband information carrying signal such that the drive signal carries the baseband information carrying signal.

14. The method of claim 8, wherein a phase difference between the frequency signal generated by the phase locked loop circuit and the drive signal generated by the power amplifier is substantially 180° or is substantially zero.

15. A method of operating a transmitter circuit, the transmitter circuit comprising:
  a phase locked loop circuit, having one or more operational characteristics indicative of an operating state of the phase locked loop circuit;
  a power amplifier; and
  a programmable delay circuit,
  the method comprising:
    measuring a particular operational characteristic of the phase locked loop circuit as a first measurement value while operating the transmitter circuit with the power amplifier not operating; and
    measuring the particular operational characteristic of the phase locked loop circuit as a second measurement value while operating the transmitter circuit with the power amplifier and while the programmable delay circuit is programmed with a programming value which causes the programmable delay circuit to control a propagation delay between a frequency signal generated by the phase locked loop circuit and a drive signal of the power amplifier, such that the second measurement value differs from the first measurement value by less than a threshold.

16. The method of claim 15, further comprising operating the transmitter circuit with the programmable delay circuit programmed with the programming value to transmit an RF signal modulated by a baseband signal.

17. The method of claim 16, wherein while operating the transmitter circuit with the programmable delay circuit programmed with the programming value, a phase difference between the frequency signal generated by the phase locked loop circuit and the drive signal generated by the power amplifier is substantially 180° or is substantially zero.

18. The method of claim 15, wherein the phase locked loop circuit comprises a voltage controlled oscillator, and the particular operational characteristic of the phase locked loop circuit is an input voltage to the voltage controlled oscillator.

19. The method of claim 15, the transmitter circuit further comprising a mixer configured to modulate the frequency signal with a baseband information carrying signal.

20. The method of claim 15, wherein the phase locked loop circuit is configured to modulate the frequency signal with first data of a baseband information carrying signal, and wherein the power amplifier is configured to modulate the frequency signal with second data of the baseband information carrying signal such that the drive signal carries the baseband information carrying signal.

* * * * *